United States Patent
Shen et al.

(10) Patent No.: US 8,962,425 B2
(45) Date of Patent: Feb. 24, 2015

(54) SEMICONDUCTOR DEVICE AND METHOD OF FORMING JUNCTION ENHANCED TRENCH POWER MOSFET HAVING GATE STRUCTURE EMBEDDED WITHIN TRENCH

(75) Inventors: Zheng John Shen, Oviedo, FL (US); Patrick M. Shea, Oviedo, FL (US); David N. Okada, Chandler, AZ (US)

(73) Assignee: Great Wall Semiconductor Corporation, Tempe, AZ (US)

( * ) Notice: Subject to any disclaimer, the term of this patent is extended or adjusted under 35 U.S.C. 154(b) by 55 days.

(21) Appl. No.: 13/479,158

(22) Filed: May 23, 2012

(65) Prior Publication Data
US 2013/0313633 A1 Nov. 28, 2013

(51) Int. Cl.
*H01L 21/336* (2006.01)

(52) U.S. Cl.
USPC ........... 438/270; 438/206; 438/212; 438/268; 257/E21.629

(58) Field of Classification Search
CPC .................... H01L 29/7827; H01L 29/66666; H01L 29/4236; H01L 29/0696; H01L 29/66734; H01L 29/41741; H01L 29/7813
USPC ................. 257/328, 329, 330, 331, 332, 333, 257/E27.096, E29.118, E29.13, E29.131, 257/E29.197; 438/206, 212, 259, 268, 270, 438/E21.629
See application file for complete search history.

(56) References Cited

U.S. PATENT DOCUMENTS

| | | | |
|---|---|---|---|
| 2010/0087039 A1* | 4/2010 | Hshieh | 438/270 |
| 2012/0018800 A1* | 1/2012 | Kim | 257/330 |
| 2012/0187477 A1* | 7/2012 | Hsieh | 257/331 |
| 2013/0015494 A1* | 1/2013 | Yilmaz et al. | 257/139 |

* cited by examiner

*Primary Examiner* — Eduardo A Rodela
(74) *Attorney, Agent, or Firm* — Robert D. Atkins; Patent Law Group: Atkins and Associates, P.C.

(57) ABSTRACT

A semiconductor device has a substrate and trench formed partially through the substrate. A drain region is formed in the substrate as a second surface of the substrate. An epitaxial region is formed in the substrate over the drain region. A vertical drift region is formed along a sidewall of the trench. An insulating material is deposited within the trench. A channel region is formed along the sidewall of the trench above the insulating material. The channel region is separated from the insulating material. A gate structure is formed within the trench adjacent to the channel region. The gate structure includes an insulating layer formed along the sidewall of the trench adjacent to the channel region and polysilicon layer formed within the trench over the insulating layer. A source region is formed in a first surface of the substrate contacting the channel region.

6 Claims, 7 Drawing Sheets

SEMICONDUCTOR DEVICE AND METHOD OF FORMING JUNCTION ENHANCED TRENCH POWER MOSFET HAVING GATE STRUCTURE EMBEDDED WITHIN TRENCH

FIELD OF THE INVENTION

The present invention relates generally to electronic circuits and semiconductor devices and, more specifically, to a semiconductor device and method of forming a junction enhanced trench power MOSFET having a gate structure embedded within a trench.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment. In particular, power MOSFETs are commonly used in electronic circuits, such as communication systems and power supplies, as electric switches to enable and disable the conduction of relatively large currents in DC to DC converter applications.

The power MOSFET includes a large number of MOSFET cells or individual transistors that are connected in parallel and distributed across a surface of a semiconductor die. To maximize power conversion efficiency, the power MOSFETs must exhibit low conduction and switching losses. Conduction losses are proportional to the drain to source resistance in the operational state (RDSON) of the transistor. Switching losses are proportional to the switching frequency and internal parasitic capacitance, most significantly gate to drain capacitance (Cgd). The trench power MOSFET is widely used due to its characteristic low RDSON. However, trench power MOSFETS commonly exhibit high Cgd. The trench MOSFET structure can be modified to improve Cgd, but at the expense of significantly increased manufacturing complexity.

A lateral MOSFET has a very small gate drain overlap resulting in a significantly lower Cgd than the trench MOSFET. The low Cgd makes the lateral MOSFET well suited for high frequency switching applications. A weakness of the lateral MOSFET structure is a higher RDSON compared to the trench MOSFET. The cell pitch of the lateral MOSFET includes an extended drift region to support the required blocking voltage of the device. The extended drift region requires a larger cell pitch and therefore higher RDSON. There remains a need for power MOSFET structure with improved device performance, i.e., low Cgd and low RDSON, and efficient manufacturability.

SUMMARY OF THE INVENTION

In one embodiment, the present invention is a method of making a semiconductor device comprising the steps of providing a substrate, forming a trench partially through the substrate, forming a vertical drift region along a sidewall of the trench, depositing an insulating material within the trench, forming a channel region along the sidewall of the trench above the insulating material, forming a gate structure within the trench self-aligned to the channel region, and forming a source region in a first surface of the substrate contacting the channel region.

In another embodiment, the present invention is a method of making a semiconductor device comprising the steps of providing a substrate, forming a trench in the substrate, forming a vertical drift region along a sidewall of the trench, depositing an insulating material within the trench, forming a channel region along the sidewall of the trench, forming a gate structure within the trench over the insulating material and adjacent to the channel region, and forming a source region in a first surface of the substrate.

In another embodiment, the present invention is a method of making a semiconductor device comprising the steps of providing a substrate, forming a trench in the substrate, forming a vertical drift region along a sidewall of the trench, forming a channel region along the sidewall of the trench, forming a gate structure within the trench adjacent to the channel region, and forming a source region in a first surface of the substrate.

In another embodiment, the present invention is a semiconductor device comprising a substrate and trench formed in the substrate. A vertical drift region is formed along a sidewall of the trench. A channel region is formed along the sidewall of the trench. A gate structure is formed within the trench adjacent to the channel region. A source region is formed in a first surface of the substrate.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Figure 1:
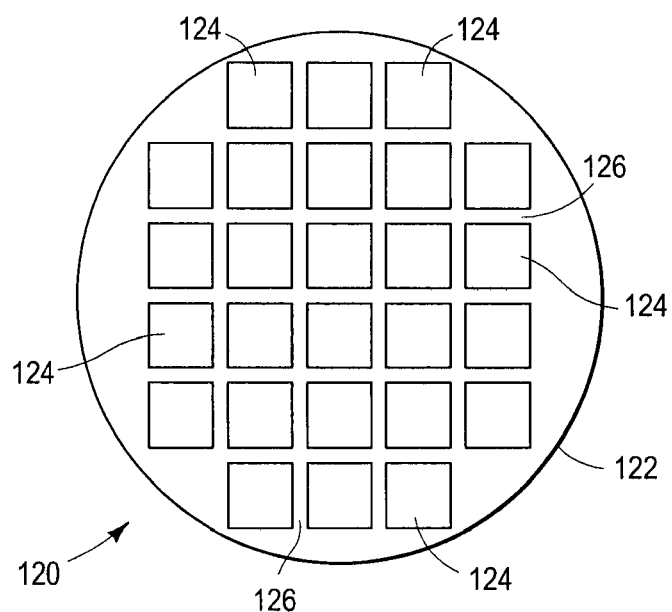
FIG. 1 illustrates a semiconductor wafer containing a plurality of semiconductor die separated by a saw street.

FIG. 1 shows a semiconductor wafer 120 containing a base material, such as silicon, germanium, gallium arsenide, indium phosphide, or silicon carbide, in substrate 122 for structural support. A plurality of semiconductor die or components 124 is formed on wafer 120 separated by a non-active, inter-die wafer area or saw street 126. Saw street 126 provides cutting areas to singulate semiconductor wafer 120 into individual semiconductor die 124.

Figure 2A:
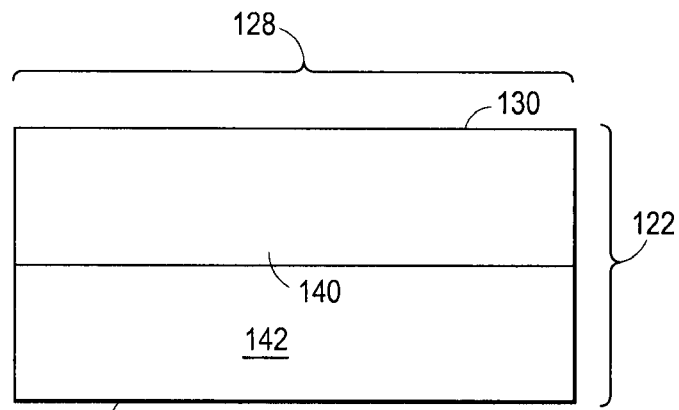
FIGS. 2a-2r illustrate a plurality of MOSFET cells with a gate structure embedded in a trench.
Figure 2B:
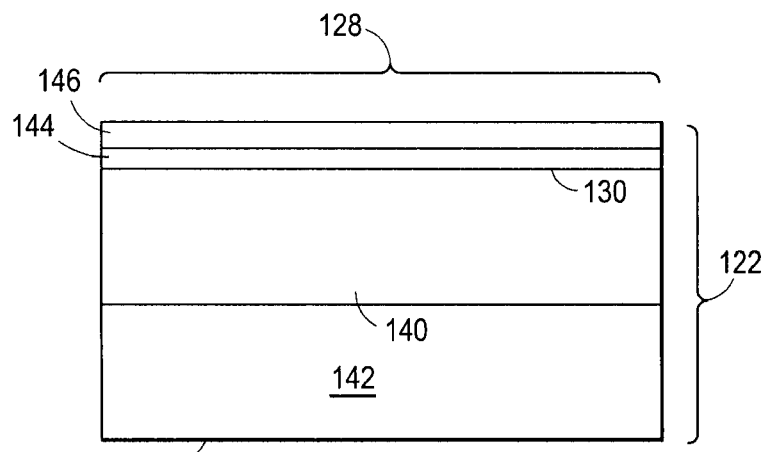
Figure 2C:
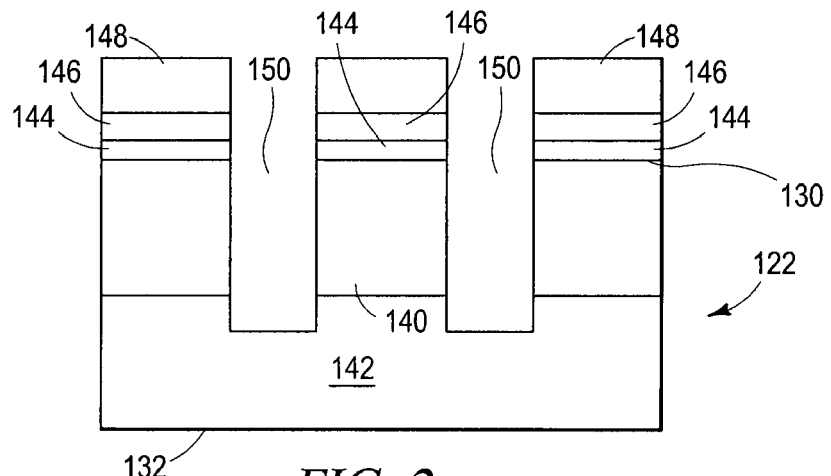
Figure 2D:
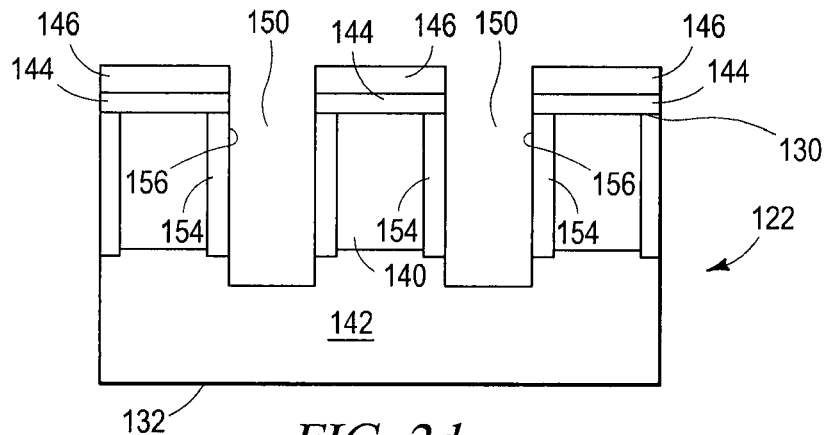
Figure 2E:
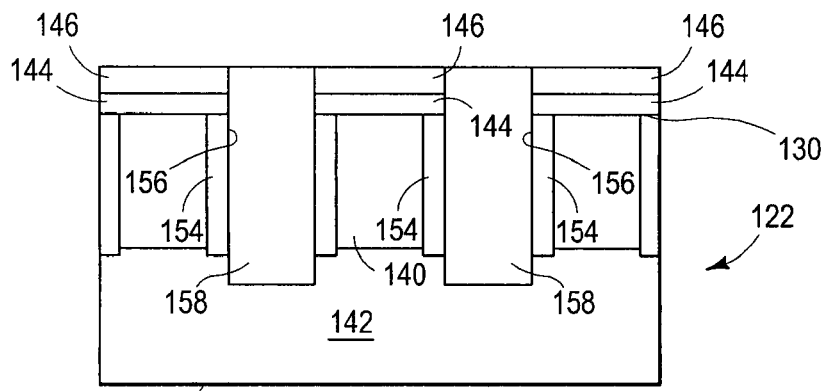
Figure 2F:
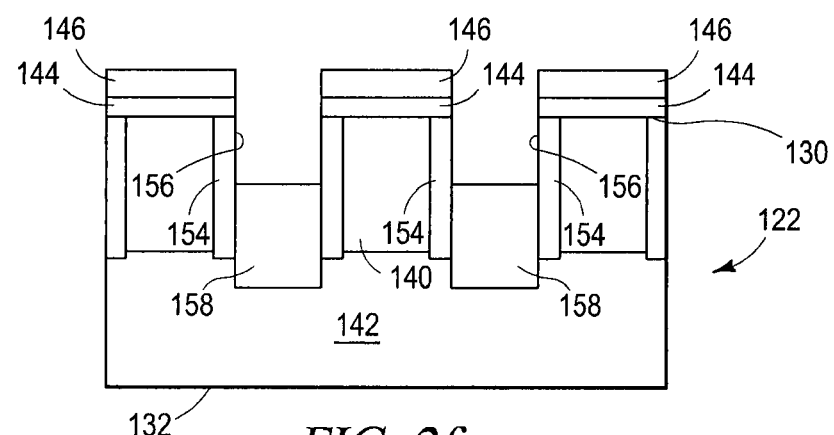
Figure 2G:
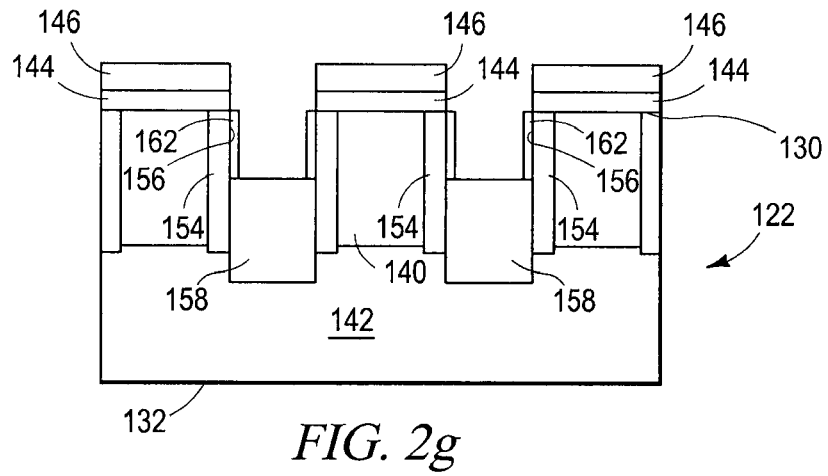
Figure 2H:
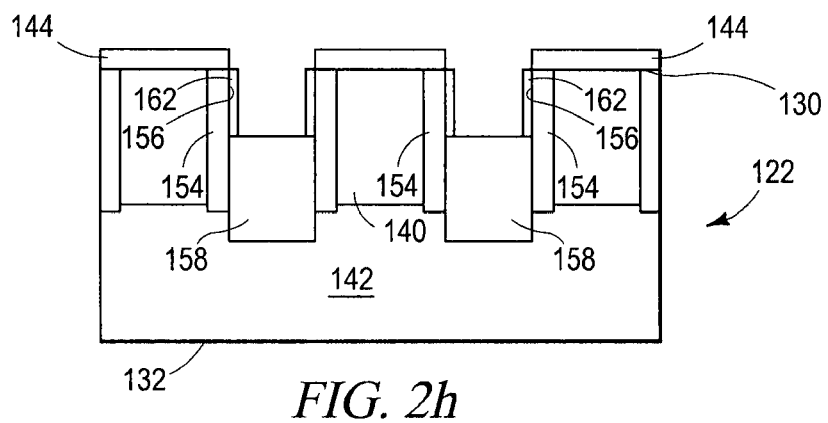
Figure 2I:
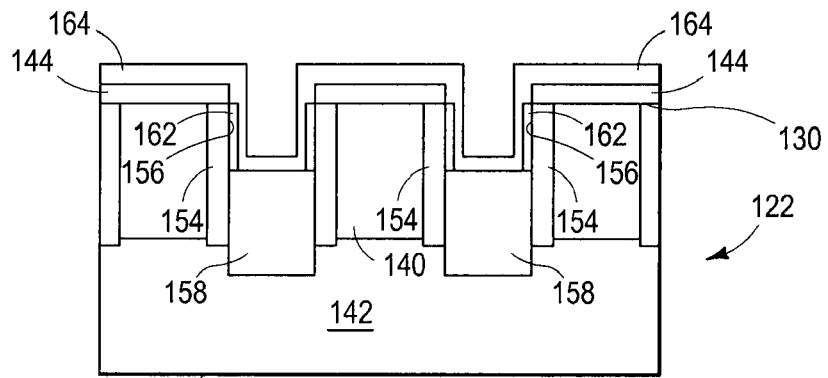
Figure 2J:
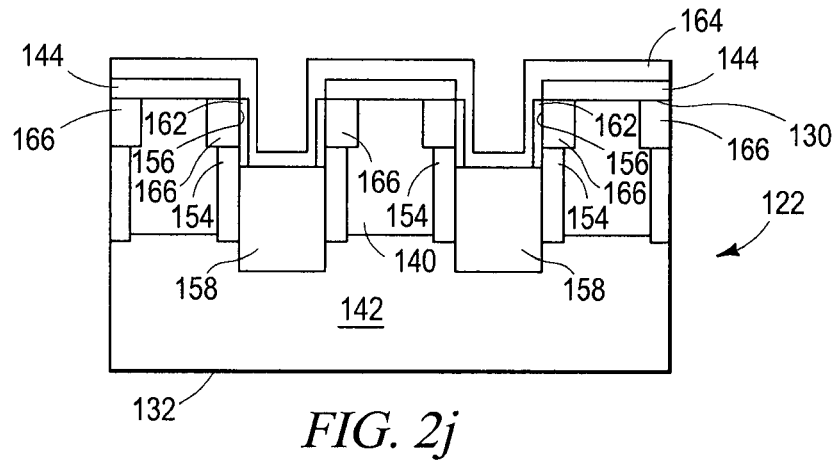
Figure 2K:
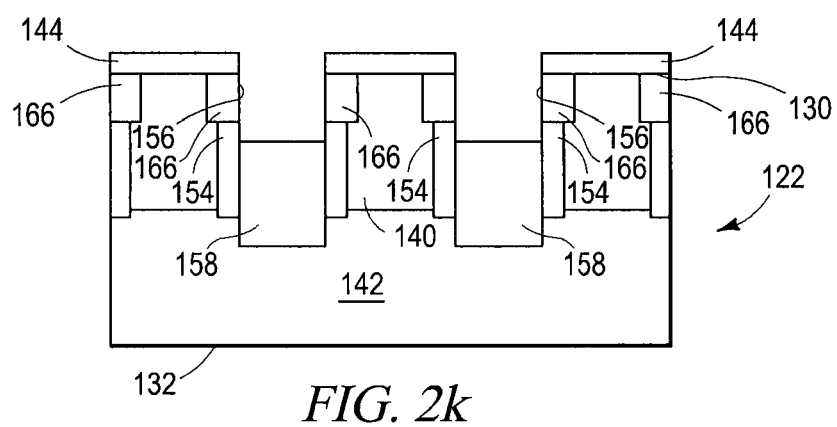
Figure 2L:
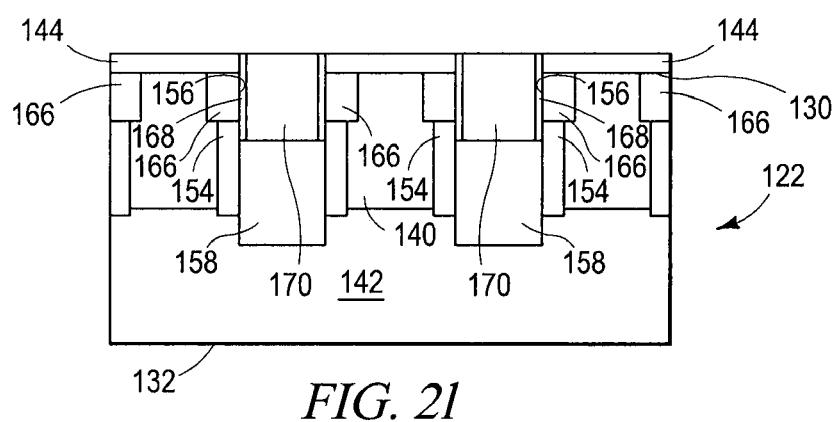
Figure 2M:
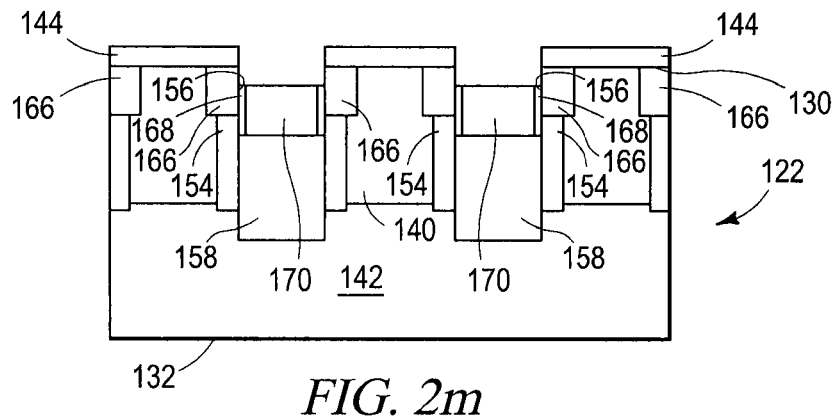
Figure 2N:
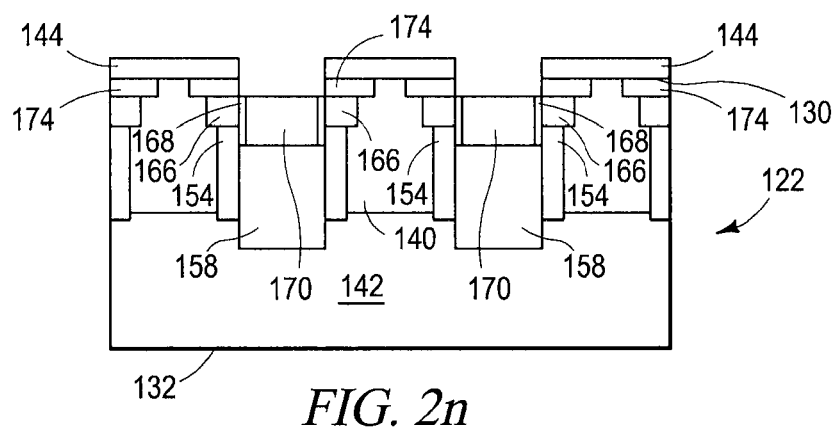
Figure 2O:
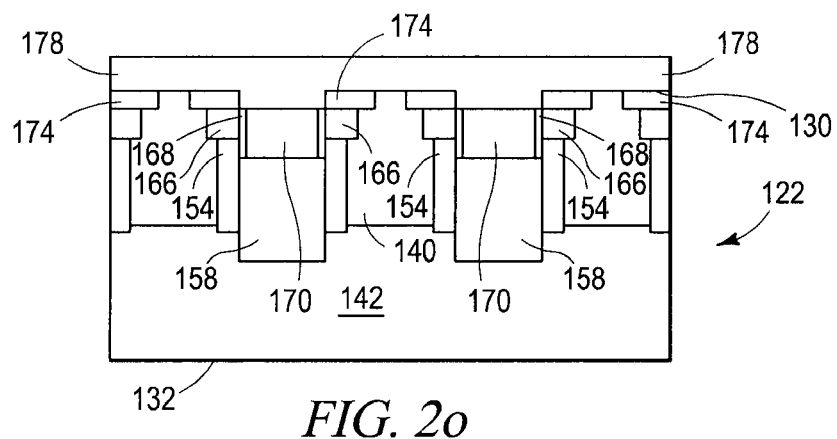
Figure 2P:
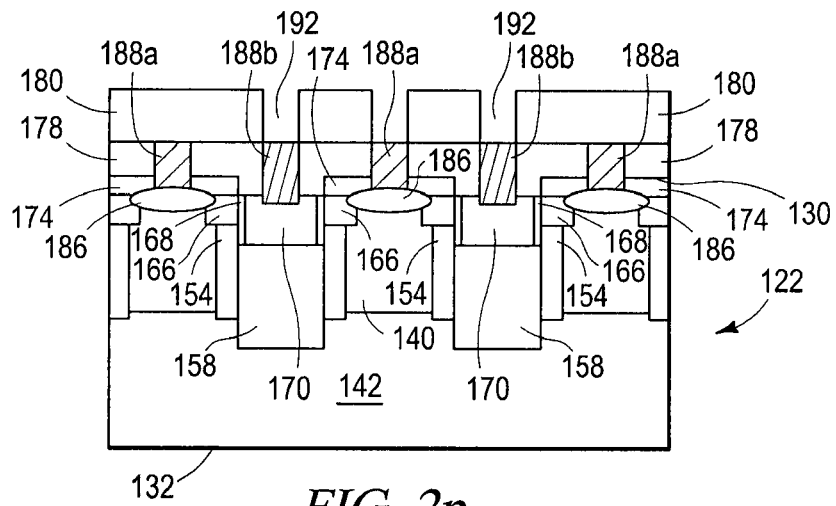
Figure 2Q:
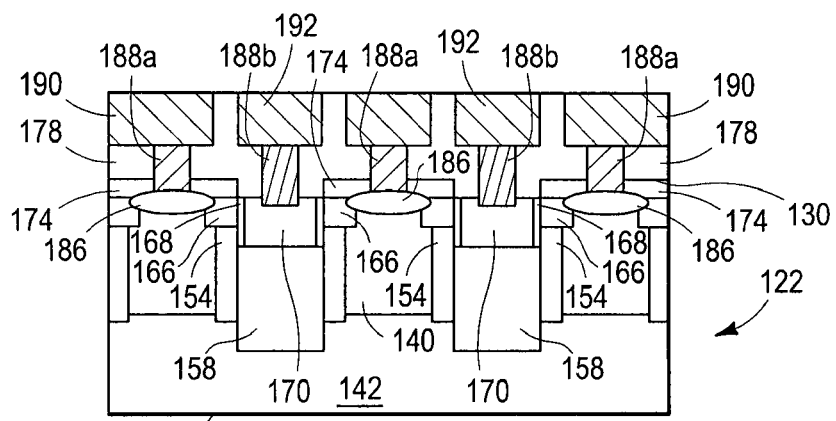
Figure 2R:
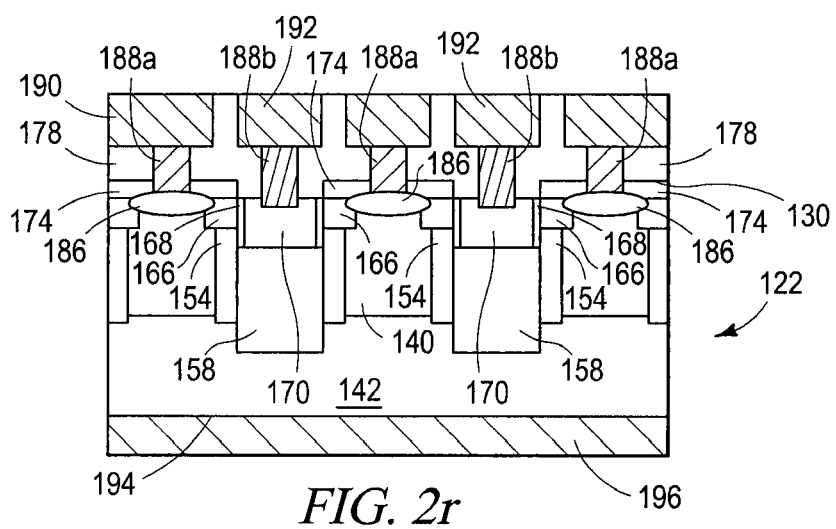

FIGS. 2a-2r illustrate a process of forming a junction enhanced trench MOSFET cell having an embedded gate structure within a power MOSFET for a high current carrying application. In one embodiment, semiconductor die 124 contains a plurality of MOSFET cells 128 electrically connected in parallel to form a power MOSFET for high current carrying capacity in the range of 1-100 amperes (A) with a voltage rating of 10-300 volts (V). FIG. 2a shows a cross-sectional view of a portion of semiconductor wafer 120 for the formation of a plurality of MOSFET cells 128, as part of the power MOSFET, within substrate 122 for semiconductor die 124. The power MOSFET can be an n-channel device or a p-channel device, where "p" denotes a positive carrier type (hole) and "n" denotes a negative carrier type (electron). Although the present embodiment is described in terms of an N-MOS device, the opposite type semiconductor material can be used to form a P-MOS device.

Substrate 122 includes an active surface 130 and back surface 132 that is opposite the active surface. For N-MOS devices, substrate 122 includes p-epitaxial region 140 and N+ drain region 142. Substrate 122 is initially made with n-type semiconductor material, such as phosphorus, antimony, or arsenic. The p-epitaxial region 140 is grown onto the N+ substrate. In one embodiment, p-epitaxial region 140 has a thickness of 1-10 micrometers (μm), and N+ drain region 142 has a thickness of 100-700 μm. Alternatively, an n-epitaxial layer can be used to form region 140.

In FIG. 2b, an insulating layer 144 is formed over active surface 130 using physical vapor deposition (PVD), chemical vapor deposition (CVD), thermal oxidation, or other suitable deposition process. The insulating layer 144 contains one or more layers of silicon dioxide ($SiO_2$), tantalum pentoxide ($Ta_2O_5$), aluminum oxide ($Al_2O_3$), or other suitable oxide material. An insulating or dielectric layer 146 is formed over insulating layer 144. The insulating layer 146 contains one or more layers of silicon nitride ($Si_3N_4$), silicon oxynitride (SiON), polyimide, benzocyclobutene (BCB), polybenzoxazoles (PBO), or other suitable dielectric material. The insulating layer 146 is formed using PVD, CVD, screen printing, spin coating, spray coating, or other suitable deposition process. In one embodiment, insulating layer 144 is an oxide layer with a thickness of 2000 angstroms (Å), and insulating layer 146 is a nitride layer with a thickness of 1000 Å. The insulating layers 144 and 146 operate as an etch stop for subsequent processing steps.

In FIG. 2c, a photoresist layer 148 is formed over insulating layer 146. A portion of photoresist layer 148 is removed and trench 150 is formed by a photolithography process through insulating layers 144-146 and epitaxial region 140 and extending partially into N+ region 142. Alternatively, trench 150 is formed by laser direct ablation (LDA). In one embodiment, trench 150 has a width of 0.5 μm and depth of 2 μm.

In FIG. 2d, photoresist layer 148 is removed. A vertical drift region 154 is formed in sidewall 156 of trench 150 using an angled ion implantation of n-type dopant, such as phosphorus, antimony, or arsenic, with dosage of 7E+12 atoms/$cm^2$ at 50 keV. Other implants can be deposited at appropriate dosages and energy levels. The vertical LDD region 154 can also be formed using a chain of high energy doped regions, PVD, or other doping techniques.

In FIG. 2e, trench 150 is filled with an insulating material 158. In one embodiment, insulating material 158 includes tetraethyl-orthosilicate (TEOS) deposited using a high-temperature low-pressure deposition process, such as vapor deposition. Alternatively, insulating material 158 can be one or more layers of $SiO_2$, $Si_3N_4$, SiON, $Ta_2O_5$, $Al_2O_3$, polyimide, BCB, PBO, or other suitable dielectric material. The insulating material 158 has a low dielectric constant to reduce parasitic capacitance across the TEOS-filled trench 150.

In FIG. 2f, a portion of insulating material 158 in trench 150 is removed by a photolithography process, leaving a portion of insulating material 158 remaining in the trench. The insulating layer 146 operates as a mask for etching insulating material 158, while protecting insulating layer 144. Alternatively, a portion of insulating material 158 in trench 150 is removed by LDA. The top surface of the remaining insulating material 158 is disposed within vertical drift region 154. In one embodiment, the remaining insulating material 158 occupies 30-70% of trench 150.

In FIG. 2g, an insulating layer 162 is formed over sidewall 156 of trench 150 above insulating material 158 using PVD, CVD, thermal oxidation, or other suitable deposition process. The insulating layer 162 contains one or more layers of $SiO_2$, $Ta_2O_5$, $Al_2O_3$, or other suitable oxide material. In one embodiment, insulating layer 162 is a thermally grown oxide layer having a thickness of 300 Å.

The insulating layer 146 is removed in FIG. 2h by a stripping operation. In FIG. 2i, an insulating or dielectric layer 164 is formed over insulating layers 144, 158, and 162 using PVD, CVD, screen printing, spin coating, spray coating, or other suitable deposition process. The insulating layer 164 contains one or more layers of $Si_3N_4$, SiON, polyimide, BCB, PBO, or other suitable dielectric material. In one embodiment, insulating layer 164 is a nitride layer. The insulating layer 162 operates as a pad layer to relieve stress from insulating layer 164.

In FIG. 2j, a p-type dopant, such as boron, aluminum, or gallium, is deposited into sidewalls 156 of trench 150 over a portion of vertical drift region 154 by an angled ion implantation with dosage of 2E+13 atoms/$cm^2$ at 50 keV to form p-channel region 166. Other implants can be deposited at appropriate dosages and energy levels. The insulating layers 162 and 164 inhibit the angled ion implantation along a portion of sidewall 156 immediately above the top surface of insulating material 158. Accordingly, the implantation of p-channel region 166 is self-aligned by insulating layers 162 and 164 to create separation with respect to the top surface of insulating layer 158. A combination of the thickness of insulating layers 162 and 164 with the angled ion implant energy and dosage p-type of dopant restricts formation of p-channel region 166 along sidewall 156 immediately above the top surface of insulating material 158. The p-channel region 166 occupies an area along sidewall 156 extending from a point above insulating material 158 to the opening of trench 150 at active surface 130. In one embodiment, the vertical separation between p-channel region 166 and the top surface of insulating layer 158 is 0.1 μm.

In FIG. 2k, insulating layers 162 and 164 are removed by a stripping operation or etching process.

In FIG. 2l, an insulating layer 168 is formed over sidewall 156 of trench 150 above insulating layer 158 and adjacent to p-channel region 166 using PVD, CVD, thermal oxidation, or other suitable deposition process. The insulating layer 168 contains one or more layers of $SiO_2$, $Ta_2O_5$, $Al_2O_3$, or other suitable oxide material. In one embodiment, insulating layer 168 is an oxide layer with a thickness of 30 nanometers (nm). A polysilicon layer 170 is formed within trench 150 over insulating layers 158 and 168. The insulating layer 168 and polysilicon layer 170 constitute a gate structure embedded within trench 150 above insulating material 158. The gate structure is disposed adjacent to p-channel region 166. The polysilicon layer 170 is planarized using chemical mechanical polishing (CMP). The insulating layer 144 operates as a mask to protect active surface 130 during CMP.

In FIG. 2m, a portion of polysilicon layer 170 is removed by etching or oxidation process to a level below active surface 130. The insulating layer 144 operates as a mask to protect active surface 130 during the etching or oxidation process.

In FIG. 2n, substrate 122 is heavily doped with n-type semiconductor material, such as phosphorus, antimony, or arsenic, within p-epitaxial region 140 to form N+ source region 174 contacting p-channel region 166. In one embodiment, the n-type dopant is deposited by ion implantation with dosage of 3E+15 atoms/cm² at 50 keV. Other implants can be deposited at appropriate dosages and energy levels. For example, a p-type semiconductor material, such as phosphorus, antimony, or arsenic, can be ion implanted with dosage of 5E+11 atoms/cm² at 40 keV to adjust the voltage threshold ($V_{TH}$) of MOSFET cell 128. The formation of N+ source region 174 can use a combination of angled and vertical ion implantation. N+ source region 174 is self-aligned to trench 150 with a width of 1.5 µm and extending to a depth of 20 nm below active surface 130.

In FIG. 2o, an insulating layer 178 is formed over active surface 130 using PVD, CVD, screen printing, spin coating, spray coating, or other suitable deposition process. In one embodiment, insulating layer 178 includes TEOS deposited using a high-temperature low-pressure deposition process, such as vapor deposition. Alternatively, insulating layer 178 can be one or more layers of SiO2, Si3N4, SiON, Ta2O5, Al2O3, polyimide, BCB, PBO, or other suitable dielectric material.

In FIG. 2p, a photoresist layer 180 is formed over insulating layer 178. A portion of photoresist layer 180 is removed by a photolithography process to form openings 182 extending down through insulating layer 178 and N+ source region 174 to p-epitaxial region 140. One opening 182 extends down through insulating layer 178 to polysilicon layer 170. Alternatively, openings 182 are formed by LDA. A p-type dopant, such as boron, aluminum, or gallium, is deposited by ion implantation with dosage of 1E+15 atoms/cm² at 30 keV into openings 182 over N+ source region 174 to form P+ regions 186 as an ohmic contact overlapping N+ source region 174 and epitaxial region 140.

An electrically conductive material 188 is deposited into openings 182 using PVD, CVD, electrolytic plating, electroless plating, sputtering, or other suitable metal deposition process. Conductive material 188 can be one or more layers of Al, Cu, Sn, Ni, Au, Ag, tungsten (W), or other suitable electrically conductive material. Conductive material 188a operates as a source contact electrically connected to N+ source region 174 and p-epitaxial region 140. Conductive material 188b operates as a gate contact electrically connected to polysilicon layer 170.

In FIG. 2q, photoresist layer 180 is removed. An electrically conductive layer 190 is formed over insulating layer 178 and conductive material 188a. An electrically conductive layer 192 is formed over insulating layer 178 and conductive material 188b. Conductive layers 190-192 are formed using PVD, CVD, electrolytic plating, electroless plating, sputtering, or other suitable metal deposition process. Conductive layers 190-192 can be one or more layers of Al, Cu, Sn, Ni, Au, Ag, W, or other suitable electrically conductive material. Conductive layer 190 is a source metal 1 interconnect layer electrically connected to conductive material 188a. Conductive layer 192 is a gate metal 1 interconnect layer electrically connected to conductive material 188b.

A portion of back surface 132 of substrate 122 is optionally removed by backgrinding or CMP to planarize surface 194 and reduce the thickness of substrate 122. In one embodiment, substrate 122 has a thickness of 200 µm after backgrinding.

In FIG. 2r, an electrically conductive layer 196 is formed over planarized surface 194 of substrate 122 using PVD, CVD, electrolytic plating, electroless plating, sputtering, or other suitable metal deposition process. Conductive layer 196 can be one or more layers of Al, Cu, Sn, Ni, Au, Ag, W, or other suitable electrically conductive material. Conductive layer 196 operates as a drain contact electrically connected to N+ drain region 142.

In operation of the MOSFET cell 128, a voltage is applied to polysilicon layer 170 through conductive material 188b to create an electric field across p-channel region 166. The surface of p-channel region 166 inverts forming an n-type surface conductive channel between N+ source region 174 and vertical drift region 154. A current flows through source contact 188a and laterally through N+ source region 174 and then vertically down n-channel, vertical drift region 154, and N+ drain region 142 to drain contact 196. A large number of MOSFET cells 128 are connected in parallel across substrate 122 to conduct a total current through the junction enhanced trench MOSFET in the range of 1-100 A with a voltage rating of 10-300 V.

The current through the power MOSFET has a lateral component from source contact 188a through N+ source region 174, and a vertical component through p-channel region 166, vertical drift region 154, and N+ drain region 142 to drain contact 196. The vertical component of the current through p-channel region 166, vertical drift region 154, and N+ drain region 142 substantially reduces RDSON of the power MOSFET. MOSFET cell 128 has low gate to drain capacitance by nature of the vertical self-alignment of the bottom edge of gate polysilicon layer 170 to the bottom edge of p-channel region 166. The self-alignment minimizes the gate and vertical drift region overlap thereby reducing Cgd. The gate structure, including insulating layer 168 and polysilicon layer 170, embedded within trench 150 substantially reduces the pitch of MOSFET cell 128, e.g., 2.0 µm, and die size of semiconductor die 124. In one embodiment, vertical drift region 154 and p-epitaxial region 140 form charge balanced n- and p-type columns, forming a superjunction and further reducing RDSON. The name of junction enhanced trench MOSFET originates from the superjunction operation mode of the device.

While one or more embodiments of the present invention have been illustrated in detail, the skilled artisan will appreciate that modifications and adaptations to those embodiments may be made without departing from the scope of the present invention as set forth in the following claims.

The invention claimed is:

1. A method of making a semiconductor device, comprising:
   providing a substrate;
   forming a trench partially through the substrate;
   forming a vertical drift region along a sidewall of the trench;
   depositing an insulating material within the trench;
   forming a first insulating layer in the trench over the insulating material;
   forming a channel region along the sidewall of the trench while the first insulating layer inhibits formation of the channel region along a portion of the sidewall of the trench above the insulating material;
   removing the first insulating layer;
   forming a gate structure within the trench on the insulating material; and forming a source region in a first surface of the substrate contacting the channel region.

2. The method of claim 1, wherein providing the substrate includes:
providing a semiconductor material doped with a first carrier type as a drain region; and
forming an epitaxial region doped with a second carrier type on the semiconductor material.

3. The method of claim 2, further including:
forming a second insulating layer over the first surface of the substrate;
forming a first conductive layer over the second insulating layer electrically connected to the source region; and
forming a second conductive layer over a second surface of the substrate electrically connected to the drain region.

4. The method of claim 1, wherein forming the gate structure includes:
forming a second insulating layer over the sidewall of the trench adjacent to the channel region; and
forming a polysilicon layer within the trench over the second insulating layer.

5. The method of claim 1, further including forming the vertical drift region by angled ion implantation.

6. The method of claim 1, further including depositing the insulating material to include a top surface within a height of the vertical drift region.

* * * * *